(12) United States Patent
Elward

(10) Patent No.: US 6,835,579 B2
(45) Date of Patent: Dec. 28, 2004

(54) METHOD OF MONITORING INTERNAL VOLTAGE AND CONTROLLING A PARAMETER OF AN INTEGRATED CIRCUIT

(75) Inventor: John S. Elward, San Jose, CA (US)

(73) Assignee: Xilinx, Inc, San Jose, CA (US)

( * ) Notice: Subject to any disclaimer, the term of this patent is extended or adjusted under 35 U.S.C. 154(b) by 0 days.

(21) Appl. No.: 10/314,626

(22) Filed: Dec. 9, 2002

(65) Prior Publication Data

US 2003/0080407 A1 May 1, 2003

Related U.S. Application Data

(62) Division of application No. 09/568,214, filed on May 9, 2000, now Pat. No. 6,512,289.

(51) Int. Cl.[7] .............................................. H01L 21/66
(52) U.S. Cl. ........................... 438/15; 257/691; 257/48; 257/773
(58) Field of Search ........................ 257/48, 691, 773, 257/780; 438/15

(56) References Cited

U.S. PATENT DOCUMENTS

| | | | |
|---|---|---|---|
| 4,220,917 A | 9/1980 | McMahon, Jr. | |
| 5,155,065 A | 10/1992 | Schweiss | |
| RE34,363 E | 8/1993 | Freeman | |
| 5,286,656 A | 2/1994 | Keown et al. | |
| 5,436,558 A | 7/1995 | Saitoh et al. | |
| 5,801,536 A | 9/1998 | Brambilla et al. | |
| 5,844,317 A | 12/1998 | Bertolet et al. | |
| 5,900,643 A | 5/1999 | Preslar et al. | |
| 6,180,426 B1 * | 1/2001 | Lin | 438/15 |

FOREIGN PATENT DOCUMENTS

JP        31223 A        1/2000

OTHER PUBLICATIONS

"The Programmable Logic Data Book 1999"; available from Xilinx, Inc., 2100 Logic Drive, San Jose, CA 95124; pp. 3–10 to 3–12.
"The Programmable Logic Data Book 1999"; available from Xilinx, Inc., 2100 Logic Drive, San Jose, CA 95124; pp. 5–68 to 5–69.

* cited by examiner

*Primary Examiner*—Ori Nadav
(74) *Attorney, Agent, or Firm*—Jeanette S. Harms

(57) ABSTRACT

An integrated circuit (I/C) assembly includes a dedicated voltage sensor line for determining with a high degree of accuracy the operating voltage at a predetermined sensor point on the IC die. The dedicated voltage sensor line connects the sensor point to an input/output (I/O) structure of the IC die, which in turn is connected to a voltage sense pin on the package of the IC assembly. In this manner, an end user can accurately monitor the operating voltage at the voltage sensor point on the IC. Additionally, an end user can connect a control circuit to the voltage sensor pin to control either the supply voltage or secondary parameters.

10 Claims, 1 Drawing Sheet

METHOD OF MONITORING INTERNAL VOLTAGE AND CONTROLLING A PARAMETER OF AN INTEGRATED CIRCUIT

FIELD OF INVENTION

This invention relates to an integrated circuit (IC) assembly that permits a user to monitor and control a parameter at the core of the IC.

BACKGROUND OF THE INVENTION

Programmable logic devices (PLDS) are user configurable integrated circuits (ICs) that implement digital logic functions. Field programmable gate arrays (FPGAs), one type of PLD, typically include configurable logic blocks (CLBs), input/output (I/O) blocks, and a programmable routing matrix for interconnecting the CLBs and I/O blocks. FPGAs, in general, are described in U.S. Pat. No. Re 34,363, reissued on Aug. 31, 1993 and incorporated by reference herein.

In the Virtex™ family of FPGAs, the programmable routing matrix provides five types of routing resources. "The 1999 Xilinx Programmable Logic Data Book", pages 3-10 to 3-12. The first type of routing resource, local routing, is used for interconnecting elements within each CLB and horizontally adjacent CLBs. The second type of routing resource, general purpose routing, is located in the horizontal and vertical routing channels associated with the rows and columns of CLBs. General purpose routing includes general routing matrices (GRMs) that provide CLBs access to the general purpose routing, single-length lines that connect adjacent GRMs, buffered Hex lines that connect GRMs six blocks away, and long lines that distribute signals across the FPGA. The third type of routing resource, I/O routing, provides an interface between the CLB array and the I/O blocks. The fourth type of routing resource, dedicated routing, is provided for on-chip tristate buses and for carry signals. In the Virtex FPGA, four partitionable tristate bus lines are provided for each CLB row and two nets per CLB propagate carry signals vertically to the adjacent CLB. Finally, the fifth type of routing resource, global routing, distributes clocks and other signals having high fanout throughout the device. Primary global routing includes four dedicated global nets for distributing clock signals. Secondary global routing includes 24 backbone lines, 12 lines at the top of the chip and 12 lines at the bottom, that can distribute clock or non-clock signals.

Other families of FPGAs provide different routing resources as well as different CLB and I/O block elements. Other types of PLDs, such as complex programmable logic devices (CPLDs), also vary significantly in architecture.

Due to the programmability of function generators, I/O blocks, and routing resources, PLDs have a wide range of power consumption. Moreover, typically because of system constraints, PLDs must also operate under a wide range of frequencies, which also affects their power consumption. Finally, as PLDs are being designed with reduced process geometries, PLDs have lower operating voltages, thereby also affecting their power consumption.

A PLD assembly typically experiences a voltage drop due to the resistances of its various components. Ohm's Law states that a voltage is equal to the product of the current flowing through a component and that component's resistance ($V = I \times R$). Therefore, as current flow increases in the PLD, the voltage drop experienced in the PLD assembly increases proportionally. As a result, the voltage applied at the core of the IC die in the PLD assembly can be significantly lower than the supply voltage. Moreover, with the trend toward lower supply voltages, there is very little margin for voltage drop before reduced performance and/or functional errors may occur at the core of the IC die.

To address these concerns, those skilled in the art have proposed several solutions. For example, one typical solution is to provide a voltage regulator at a location on the printed circuit board (PCB) that is central to its destination ICs. In this manner, the resistive path to the PLD is reduced and any voltage drop on the path is minimized. Occasionally, centralized voltage regulators also use a sensor point located on the PCB to regulate voltage at that localized point. With such solutions, however, the voltage drop of the PLD itself is not monitored or reduced.

Another proposed solution is to add more power pins to the PLD, thereby reducing the effective resistance of resistive paths within the PLD. However, with increased functionality requirements, many PLDs are already pad limited. Therefore, the advantage of a possible reduced voltage drop is more than offset by the significant disadvantage of reduced input/output connectivity.

Therefore, a need has arisen for a structure and method that can accurately monitor the voltage at a particular location on the PLD as well as compensate for a voltage drop on the PLD, all without significantly affecting input/output connectivity.

SUMMARY OF THE INVENTION

The present invention addresses these problems by adding a sensor point on an integrated circuit (IC) die. In one embodiment, the sensor point is centrally located on the IC die and a dedicated sensor trace connects the sensor point to one of a plurality of input/output (I/O) structures located at the periphery of the IC die. A power bond wire connects that I/O structure to a dedicated voltage sensor pin provided on the IC's package.

In this manner, the end user can accurately monitor the voltage at the sensor point on the IC die. This information can then be advantageously used to regulate the power supply on the IC die. Specifically, if the voltage is deviating from an acceptable range, the end user can provide a different external voltage, thereby ensuring a proper internal operating voltage on the IC die.

Moreover, information from the sensor point can also be used to improve various engineering features including circuit architecture, packaging, printed circuit board design, and other design areas. Additionally, information from the sensor point can be used to control secondary system parameters, such as clock speed, fan speed, software routines, and IC programming.

DETAILED DESCRIPTION OF THE INVENTION

Figure 1:
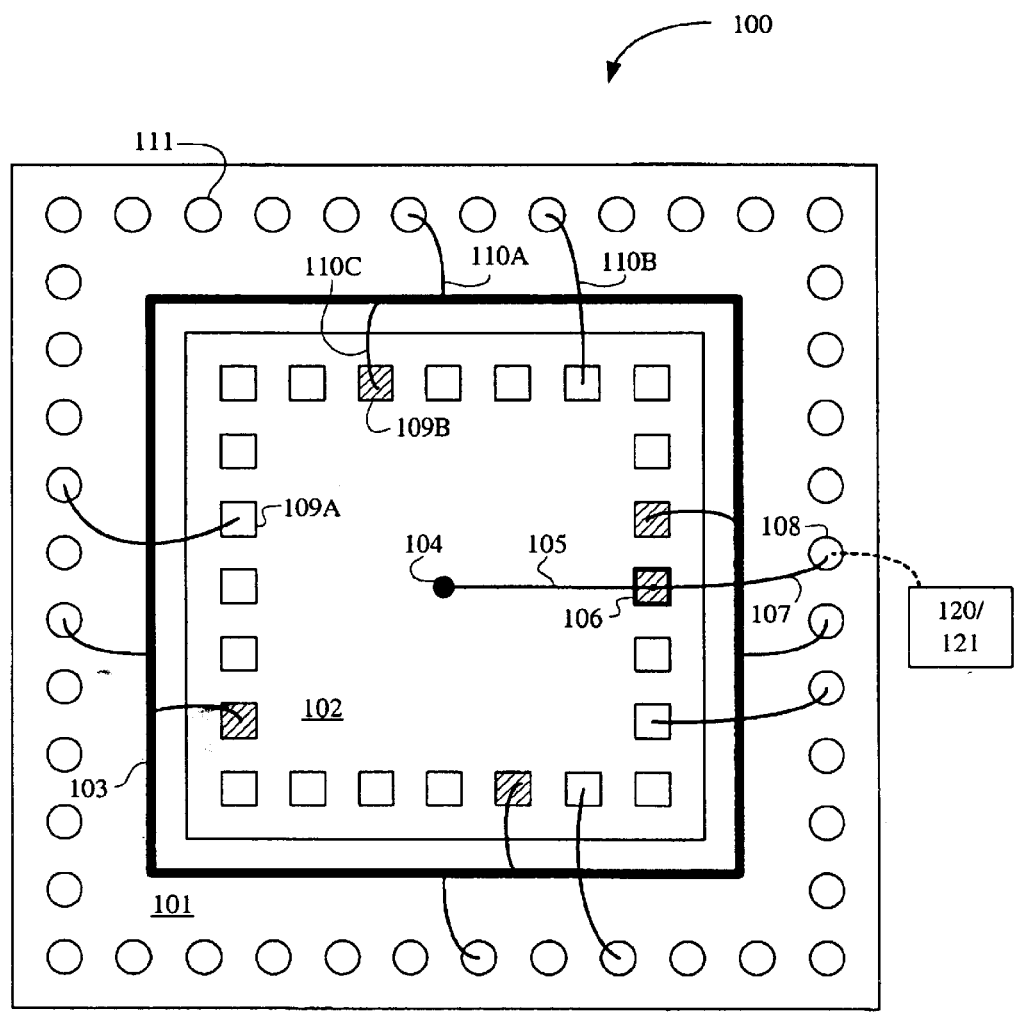
FIG. 1 is a simplified view of a programmable logic device assembly in accordance with the present invention.

FIG. 1 illustrates one embodiment of an assembly 100 in accordance with the present invention. Assembly 100 may be a "cavity-up" or "cavity-down" assembly. In a cavity-up assembly, an integrated circuit (IC) die 102 is attached to the inside bottom of a package 101. In a cavity-down assembly, die 102 is attached to the inside top of package 101, thereby providing optimal heat transfer to the ambient air. Assembly 100 includes a package 101, a die 102 having a plurality of input/output (I/O) structures 109 for providing signals to and from die 102, and a power structure 103. Package 101 may be ceramic or any other form of packaging material. Die 102 may be a programmable logic device (PLD) or any other type of integrated circuit (IC).

In this embodiment, power structure 103 is formed as a conductive metal ring and is built into the cavity of package 101. In other embodiments, the power structure may be formed as a conductive metal plane of package 101. Power structure 103 is typically connected to predetermined power I/O structures 109B (shown as squares having a fill pattern) with power bond wires 110C. Having multiple power I/O structures 109B connected to power structure 103 collectively decreases the net resistance between package 101 and die 102. Each power I/O structure 109B includes a sandwich of a metal pad layer, a power bond wire 110C, and an internal power bus (described below).

Note that a typical assembly includes two power structures, one structure for the highest circuit voltage VDD on the die and another structure for the lowest circuit voltage VSS on the die. In FIG. 1, power structure 103 provides voltage VDD to die 102. The power structure for voltage VSS (not shown for clarity) is connected to its associated power I/O structures 109B of die 102 in the same manner as power structure 103. Note that although only four power I/O structures 109B are shown in FIG. 1, depending on the size of the die and the functionality thereon, a die may include many more power I/O structures. Die 102 further includes a plurality of power buses (also not shown for clarity) coupled to power I/O structures 109B for distributing voltages VDD and VSS on chip.

To facilitate data communication between die 102 and external devices (not shown), data I/O structures 109A are connected to pins 111 on package 101 via pin bond wires 110B. Each data I/O structure 109A includes a pad and I/O circuitry. In one embodiment, if die 102 is a programmable logic device, then the I/O circuitry includes an I/O block. For more detailed information on I/O blocks, see the 1999 Xilinx Data Book, pages 5-68 to 5-69, which is incorporated by reference herein.

In accordance with the present invention, assembly 100 includes at least one sensor point 104 located on die 102. Sensor point 104 is connected to an internal VDD bus (not shown) provided on die 102. Sensor point 104 can be located at any point on die 102 where it is desired to know the local operating voltage. In one embodiment, sensor point 104 is centrally located on die 102. In an alternative embodiment, multiple sensor points are provided based on the architecture or implementation of the circuits (not shown) on die 102.

A dedicated metal sensor trace 105 on die 102 connects sensor point 104 to a sensor I/O structure 106. Sensor I/O structure 106, which is similar in structure to power pads 109B, is then connected to a voltage sensor pin 108 on package 101 via a voltage sensor bond wire 107. Note that if multiple sensor points are provided, then each sensor point should have a corresponding dedicated trace, sensor I/O structure, voltage sensor bond wire, and voltage sensor pin.

In accordance with the present invention, sensor trace 105 is dedicated to providing the voltage at sensor point 104. Specifically, sensor trace 105 is not part of the standard interconnect providing signals on and functionality to die 102. For example, if die 102 is a Virtex FPGA, sensor trace 105 is not part of the local routing, general purpose routing, I/O routing, dedicated routing, or global routing. Thus, sensor trace 105 does not provide any signals associated with any CLB, I/O block, clock, or any other element/signal on die 102. The sole purpose of sensor trace 105 is for monitoring the voltage at sensor point 104.

To measure the voltage at sensor point 104, the end user applies power to assembly 100 and electrically connects a measurement device 120 to the voltage sensor pin 108. Examples of such measurement devices include a voltmeter or an input to an external voltage regulator circuit. Using the output of measurement device 120, an end user can adjust the supply voltage, i.e. voltage VDD, if the operating voltage at sensor point 104 deviates from a specified range.

In another embodiment, voltage sensor pin 108 is electrically connected to a control circuit 121, which in turn controls another circuit, component, or device. In this manner, the output of control circuit 121 automatically triggers certain actions or changes within the end user's system. For example, after power is applied to assembly 100, control circuit 121 can monitor the voltage at sense point 104 and adjust the supply voltage if the operating voltage at sense point 105 deviates from the acceptable range. Similarly, control circuit 121 can be used to control secondary systems such as clock speed, fan speed, software routines and/or reprogramming cycles (assuming die 102 is a programmable logic device). If multiple sensor points 105 are desired on assembly 100, each voltage sensor pin 108 can be connected to either control circuit 121 or measurement device 120.

The present invention provides a structure and method for monitoring the voltage at a predetermined sensor point on an IC. Although the present invention is described in reference to the embodiment shown in FIG. 1, modifications to that embodiment and other, various embodiments will be apparent to those skilled in the art. Therefore, the scope of the present invention should only be defined by the appended claims.

What is claimed is:

1. A method of facilitating monitoring an internal voltage on an integrated circuit (IC) die and controlling a parameter of the die, the method comprising:
   providing an internal sensor point on the IC die;
   directly connecting the internal sensor point to a dedicated output structure on the IC die via a dedicated trace on the IC; and directly connecting the dedicated output structure to a dedicated voltage sensor pin via a dedicated voltage sensor bond wire;

wherein the dedicated output structure is connectable to a control circuit for controlling a parameter of the die, wherein the internal sensor point provides the internal voltage of the IC and a deviation of the internal voltage from an acceptable range at the output structure triggers a change in the parameter.

2. The method of claim 1 wherein the parameter is supply voltage to the die and the control circuit adjusts the supply voltage according to a predetermined relationship.

3. The method of claim 1 wherein the parameter is clock frequency, and the control circuit adjusts the clock frequency according to a predetermined relationship.

4. The method of claim 1 wherein the parameter is fan speed, and the control circuit adjusts the fan speed according to a predetermined relationship.

5. The method of claim 1 wherein the parameter is at least one software routine used by the die, and the control circuit adjusts the software routine according to a predetermined relationship.

6. A method for monitoring an internal voltage on an integrated circuit (IC) die and controlling a parameter of the die, the IC die including an internal sensor point, a dedicated output structure, a dedicated trace coupling the internal sensor point and the dedicated output structure, a dedicated voltage sensor pin, and a dedicated voltage sensor bond wire connecting the dedicated output structure and the dedicated voltage sensor pin, the method comprising:

coupling the dedicated voltage sensor pin to a control circuit for controlling a parameter of the die; and triggering a change in the parameter by detecting a deviation of the internal voltage from an acceptable range at the dedicated voltage sensor pin, wherein using the internal sensor point, dedicated trace, dedicated output structure, dedicated voltage sensor bond wire, and dedicated voltage sensor pin ensure that the deviation is accurate.

7. The method of claim 6 wherein the parameter is supply voltage to the die and the control circuit adjusts the supply voltage according to a predetermined relationship.

8. The method of claim 6 wherein the parameter is clock frequency, and the control circuit adjusts the clock frequency according to a predetermined relationship.

9. The method of claim 6 wherein the parameter is fan speed, and the control circuit adjusts the fan speed according to a predetermined relationship.

10. The method of claim 6 wherein the parameter is at least one software routine used by the die, and the control circuit adjusts the software routine according to a predetermined relationship.

* * * * *